United States Patent [19]

Kusakabe

[11] Patent Number: 4,463,317
[45] Date of Patent: Jul. 31, 1984

[54] FM DEMODULATOR WITH REGULATION OF THE OUTPUT D.C. COMPONENT

[75] Inventor: Hiromi Kusakabe, Yokohama, Japan

[73] Assignee: Tokyo Shibaura Denki Kabushiki Kaisha, Kawasaki, Japan

[21] Appl. No.: 292,264

[22] Filed: Aug. 12, 1981

[30] Foreign Application Priority Data

Aug. 14, 1980 [JP] Japan .................................. 55-112075

[51] Int. Cl.³ .............................................. H03D 3/00
[52] U.S. Cl. ..................................... 329/103; 329/133; 329/169; 330/11; 455/214
[58] Field of Search ................ 329/103, 110, 131, 132, 329/133, 136, 168, 169, 192; 455/214, 337; 330/11, 97, 109, 110, 294

[56] References Cited

U.S. PATENT DOCUMENTS

| | | | |
|---|---|---|---|
| 3,543,169 | 11/1970 | Hill | 358/171 X |
| 3,628,046 | 12/1971 | Bilotti | 307/241 |
| 3,688,205 | 8/1972 | Burger | 329/132 |
| 4,107,624 | 8/1978 | Turner | 329/122 X |
| 4,188,586 | 2/1980 | Egami | 329/192 |
| 4,319,196 | 3/1982 | Kwan | 455/337 X |

FOREIGN PATENT DOCUMENTS 2831276  7/1979  Fed. Rep. of Germany .

OTHER PUBLICATIONS

Publication: H. Olsen, "FM Detectors", Ham Radio, Jun. 1976 (pp. 22-29).

*Primary Examiner*—Siegfried H. Grimm
*Assistant Examiner*—W. R. Paxman
*Attorney, Agent, or Firm*—Finnegan, Henderson, Farabow, Garrett & Dunner

[57] ABSTRACT

A frequency modulation detector, includes an FM (frequency modulation) demodulator, an adder responsive to first and second signals for maintaining a constant D.C. level output signal, the first signal being the FM signal, and a feedback circuit connected to the adder for comparing the D.C. output level of the adder with a reference signal level to produce the second signal.

6 Claims, 4 Drawing Figures

FM DEMODULATOR WITH REGULATION OF THE OUTPUT D.C. COMPONENT

FIELD OF THE INVENTION

This invention relates to a frequency modulation (FM) detector which produces an output whose D.C. voltage component is always constant.

BACKGROUND OF THE INVENTION

This invention simplifies the design of an audio frequency amplifier (AF amplifier), and also eliminates noise arising at the time of switching frequency bands or switching to or from other sources, e.g., an amplitude modulation (AM) detector in a set. Such noise often occurs due to a sudden change in the D.C. voltage component of input signals to the audio frequency (AF) amplifier.

Heretofore, conventional frequency modulation signal radio receivers (FM receivers) have needed AF amplifiers exhibiting a wide level response to the input signal from the frequency modulation detectors. Moreover, multi-band type conventional FM receivers or combination sets with an FM receiver section and other signal source sections, such as a tape recorder, have used decoupling capacitors connected before the AF amplifiers.

However, the decoupling capacitors are difficult to fabricate when using integrated circuits (IC's).

SUMMARY OF THE INVENTION

It is, therefore, an object of the present invention to provide an FM detector which produces an output whose D.C. component is constant.

Another object of the present invention is to provide an FM detector which is connected directly (without a decoupling capacitor) to an amplifier section.

According to the present invention, the FM detector is provided with: (a) FM detection means, (b) adder means responsive to first and second signals for maintaining a constant D.C. level output signal, the first signal being the output signal of the FM detection means, and (c) feedback means connected to the output of the adder means for comparing the D.C. output level of the adder with a reference signal level to produce the second signal.

Additional objects and advantages of the present invention will become apparent to persons skilled in the art from a study of the following description and the accompanying drawings.

DESCRIPTION OF THE PREFERRED EMBODIMENT

Figure 1:
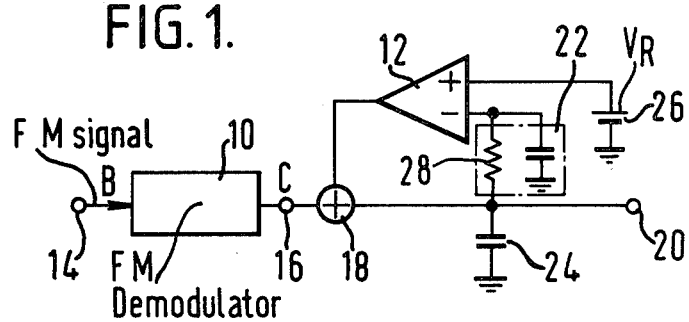
FIG. 1 shows a block diagram of a frequency modulation detector according to the present invention.

The present invention will be described in detail with reference to the accompanying drawings, FIG. 1 to FIG. 4. Throughout the drawings, like reference numerals are used to designate like or equivalent elements.

Referring to FIG. 1, there is shown a block diagram of an FM detector in accordance with a first embodiment of this invention, which comprises a conventional FM demodulator 10 and a D.C. amplifier 12. Input terminal 14 of FM demodulator 10 receives an FM signal from an IF amplifier (not shown). Output terminal 16 of FM demodulator 10 is coupled to one input terminal of adder 18. Output terminal 20 is connected to one input of D.C. amplifier 12 through low pass filter (LPF) 22 and is also connected to a bypass capacitor 24 for bypassing high frequency signal components including the carrier signal. D.C. amplifier 12 is connected at its other input to reference voltage source 26, and its output is connected to an input of adder 18.

Figure 2:
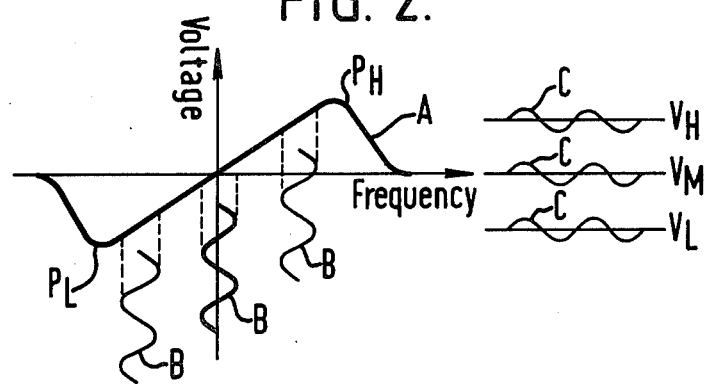
FIG. 2 is a graph showing the frequency-to-voltage response characteristic of the FM demodulator.

FM demodulator 10 has a conventional frequency-to-voltage response characteristic, a so-called S-curve characteristic, as denoted by A in FIG. 2. The FM signal denoted by B in FIG. 2 is applied to input terminal 14 and is demodulated in accordance with the S-curve A, so that the demodulated signal denoted by C in FIG. 2 appears on output terminal 16. Demodulated signal C is composed of AF signal $S_A$ and D.C. component V (three levels of the D.C. component are shown as $V_L$, $V_M$ and $V_H$).

The linear range of the S-curve A is fairly wide compared to the frequency deviation range of the FM input signal to ease tuning and avoid frequency drift of the FM signal. Accordingly, when the FM signal denoted by B in FIG. 2 varies about its center frequency along S-curve A, demodulated signal C of FM demodulator 10 varies about its D.C. component V, for example, $V_L$, $V_M$ or $V_H$.

The demodulated signal C is applied to one input terminal of adder 18. The output signal of adder 18 appears at output terminal 20 and is also applied to a first input of D.C. amplifier 12 via LPF 22. It is compared with reference voltage $V_R$ of reference voltage source 26 on a second input terminal of D.C. amplifier 12. D.C. amplifier 12 provides a D.C. output $V_O$ which is a function of the difference between reference voltage $V_R$ and D.C. component V. Any RF frequency component leaking to the output of adder 18 is bypassed through capacitor 24. D.C. output $V_O$ is applied to another input terminal of adder 18. Therefore, D.C. component V of the output signal on output terminal 20 is the D.C. voltage of the demodulated signal itself combined with the D.C. output $V_O$ of D.C. amplifier 12.

When the center frequency of the FM signal B varies, the D.C. component of the demodulated signal varies in accordance with the S-curve characteristics. Therefore, the D.C. component V of the signal on output terminal 20 is also going to vary. However, D.C. output $V_O$ of D.C. amplifier 12 varies inversely with the D.C. component V. In other words, when the level of the D.C. component V increases, D.C. output $V_O$ decreases in accordance with the increase of the D.C. component V. Accordingly, D.C. output $V_O$ operates to prevent any change of level of the D.C. component V output at terminal 20. As a result, the D.C. component V is kept at the same value as reference voltage $V_R$ in spite of changes to the center frequency of the FM signal. Therefore, the D.C. component V of the output signal at terminal 20 is always at a constant D.C. level substantially equal to the reference voltage $V_R$.

The suppression rate of change K of the D.C. component is a function of loop gain G of the negative feedback loop comprised of adder 18 and D.C. amplifier 12, and is represented as follows:

$$K = 1/G$$

The loop gain G is a function of transfer conductance gm of D.C. amplifier 12, and is represented as follows:

$$G = gm \cdot R_A$$

where $R_A$ is the resistance of resistor 28 in LPF 22.

Therefore, the suppression rate K is given by the following equation.

$$K = 1/G = \frac{1}{gm \cdot R_A}$$

The suppression rate K should be small, but an excessively small rate K causes the loop to oscillate badly. So, the best range of values for rate K is between 1/10 and 1/100, or 20 dB to 40 dB.

In a tuning operation along the S-curve A, the D.C. level on output terminal 16 of FM demodulator 10 will also vary with S-curve A. Therefore, during rapid tuning, a time rate variation of the D.C. level becomes large around inflection points $P_L$ and $P_H$ of S-curve A. These large time rate variations cause a large A.C. noise signal on output terminal 16. However, changes in D.C. level are eliminated by the operating characteristics of the negative feedback loop so that the A.C. noise signal is also eliminated.

Figure 3:
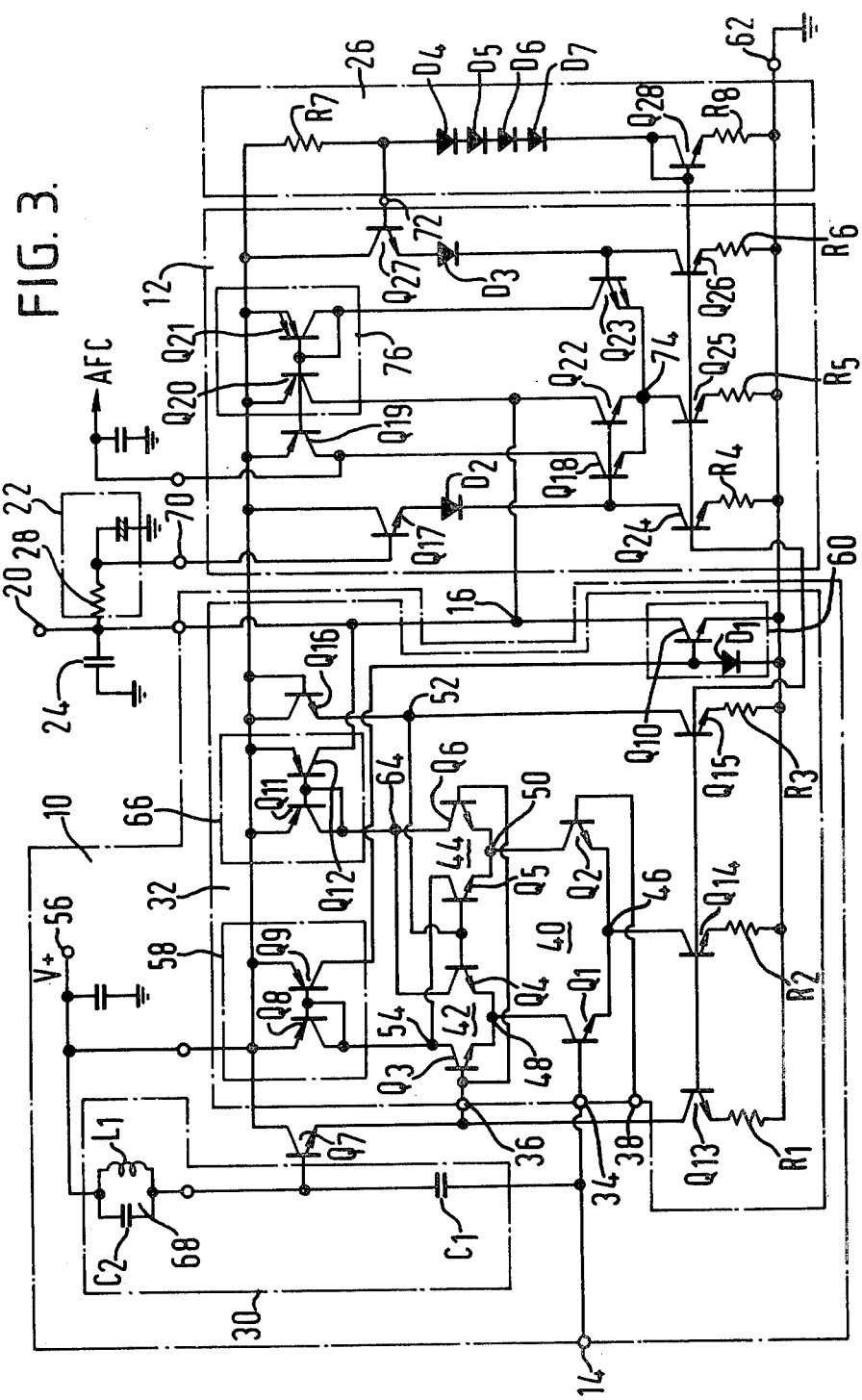
FIG. 3 shows a detailed circuit diagram of the frequency modulation detector of another embodiment of the present invention.

Referring now to FIG. 3, there is shown a detailed circuit diagram of the FM detector according to the present invention. In FIG. 3, FM demodulator 10, of a quadrature demodulation type, is comprised of quadrature phase shift circuit 30 and a double balanced demodulator 32.

Double balanced demodulator 32 is shown as having two input terminals 34 and 36 to which input signals are applied, and one common terminal 38. Demodulator 32 includes three pairs 40, 42 and 44 of NPN transistors. Respective pairs 40, 42 and 44 include two transistors connected in what is commonly referred to as a differential configuration. Transistor pair 40 includes two transistors $Q_1$ and $Q_2$, whose emitters are connected together to junction point 46. Transistor pair 42 includes two transistors $Q_3$ and $Q_4$, whose emitters are connected together to junction point 48. Similarly, transistor pair 44 includes two transistors $Q_5$ and $Q_6$, whose emitters are connected together to junction point 50.

The base of transistor $Q_1$ is connected to input terminal 34 of demodulator 32, and the base of transistor $Q_2$ is connected to common terminal 38. The collectors of transistors $Q_1$ and $Q_2$ are connected to junction points 48 and 50 respectively.

The bases of transistors $Q_3$ and $Q_6$ are directly coupled to input terminal 36 of demodulator 32, which is connected to quadrature phase shift circuit 30 via NPN transistor $Q_7$. The bases of transistors $Q_4$ and $Q_5$ are connected together to junction point 52. The collectors of transistors $Q_3$ and $Q_5$ are connected to junction point 54 which is coupled to positive potential D.C. source 56 by means of a current mirror-type active load 58 comprised of PNP transistors $Q_8$ and $Q_9$. Transistor $Q_8$ is connected by its collector and base together to junction point 54 and by its emitter to D.C. source 56. Transistor $Q_9$ is connected with its base-to-emitter path in parallel with the base-emitter path of transistor $Q_8$ and by its collector to current mirror circuit 60, the latter being comprised of diode $D_1$ and NPN transistor $Q_{10}$. Diode $D_1$ is connected in a forward bias relationship between the collector of transistor $Q_9$ and reference potential source 62, and transistor $Q_{10}$ is connected with its base-emitter path in parallel with diode $D_1$ and by its collector to output terminal 16 of FM demodulator 10.

The collectors of transistors $Q_4$ and $Q_6$ are connected to junction point 64 which is coupled to D.C. source 56 by means of a current mirror-type active load 66 comprised of PNP transistors $Q_{11}$ and $Q_{12}$. Transistor $Q_{11}$ is connected by its collector and base to junction point 54 and by its emitter to D.C. source 56. Transistor $Q_{12}$ is connected with its base-emitter path in parallel with the base-emitter path of transistor $Q_{11}$ and by its collector to output terminal 16.

Input terminal 36 and junction points 46 and 52, respectively, are connected to constant current circuits, respectively comprised of NPN transistors $Q_{13}$, $Q_{14}$ and $Q_{15}$ and corresponding emitter resistors $R_1$, $R_2$ and $R_3$. Transistor $Q_{13}$ is connected by its collector to input terminal 36 and by its emitter to reference potential source 62 via resistor $R_1$. Transistor $Q_{14}$ is connected by its collector to junction point 46 and by its emitter to reference potential source 62 via resistor $R_2$. Similarly, transistor $Q_{15}$ is connected by its collector to junction point 52 and by its emitter reference potential source 62 via resistor $R_3$.

Quadrature phase shift circuit 30 is shown as a series circuit of capacitor $C_1$ and LC tank circuit 68, the latter being comprised of capacitor $C_2$ and inductor $L_1$. LC tank circuit 68 is connected between positive potential D.C. source 56 and the base of transistor $Q_7$ whose emitter is connected to input terminal 36 of FM demodulator 32. Capacitor $C_1$ is connected at one end to the base of transistor $Q_7$ and the other end to input terminals 14 and 34.

Output terminal 16 of FM demodulator 10 is connected directly to output terminal 20 of the FM detector and to carrier bypass capacitor 24 which is connected to reference potential source 62. Output terminals 20 is connected to D.C. voltage amplifier 12 via LPF 22.

D.C. voltage amplifier 12 is shown as having inverting and non-inverting input terminals 70 and 72, respectively, and further includes a difference amplifier. Inverting input terminal 70 is connected to the base of NPN transistor $Q_{17}$ whose collector is connected to positive potential D.C. source 56. The emitter of transistor $Q_{17}$ is connected to the base of NPN transistor $Q_{18}$ via level shift diode $D_2$. The collector of transistor $Q_{18}$ is connected to positive potential D.C. source 56 via transistor $Q_{19}$. Transistor $Q_{19}$ is connected in a current mirror circuit configuration with PNP transistors $Q_{20}$ and $Q_{21}$ by means of their emitters and bases being connected together in common. Transistors $Q_{20}$ and $Q_{21}$ are connected by their emitters to positive potential D.C. source 56 and by their collectors to the collectors of NPN transistors $Q_{22}$ and $Q_{23}$ respectively. The emitters of the latter transistors are connected together at junction point 74 in common with the emitter of transistor $Q_{18}$ in a differential amplifier fashion. The base of transistor $Q_{22}$ is connected to the base of transistor $Q_{18}$.

According to a preferred embodiment, transistor $Q_{21}$ has an emitter area twice that of transistor $Q_{19}$ or $Q_{20}$. Similarly, transistor $Q_{23}$ has an emitter area twice that of transistor $Q_{18}$ or $Q_{22}$. The bases of transistors $Q_{18}$ and $Q_{22}$, junction point 74 and the base of transistor $Q_{23}$, respectively, are connected to constant current circuits, comprised of NPN transistors $Q_{24}$, $Q_{25}$ and $Q_{26}$ and emitter resistors $R_4$, $R_5$ and $R_6$. The base of transistor $Q_{23}$ is connected to non-inverting input terminal 72 via level shift diode $D_3$ and a base-emitter path of transistor $Q_{27}$ the collector of the latter being connected to positive potential D.C. source 56.

Non-inverting input terminal 72 of D.C. voltage comparator 12 is coupled to reference voltage source 26 which is a series circuit of resistor $R_7$, a series set of four level shift diodes $D_4$, $D_5$, $D_6$, and $D_7$, NPN transistor $Q_{28}$ connected in diode fashion and emitter resistor $R_8$, all being connected between positive potential D.C. source 56 and reference potential source 62. Junction point 76 between resistor $R_7$ and diode $D_4$ is coupled to non-inverting input terminal 72, and the base of transistor $Q_{28}$ is coupled to the bases of all constant current circuit transistors $Q_{13}$, $Q_{14}$, $Q_{15}$, $Q_{24}$, $Q_{25}$ and $Q_{26}$.

Operation of the FM detector shown in FIG. 3 is described as follows. An FM signal applied to input terminal 14 of the FM detector diverges in two paths, one being directly applied to input terminal 34 of double balanced demodulator 32 and the other being applied to input terminal 36 through quadrature phase shift circuit 30. FM signal on input terminal 36 is out of phase by 90 degrees from FM signal on input terminal 34. These FM signals are multiplied with each other by means of double balanced demodulator 32 so that demodulated signals in opposite phases appear on junction points 54 and 64. These demodulated signals are processed through current mirror circuits 58 and 66, respectively, and combined to produce one demodulated signal present at output terminal 16. The demodulated signal is taken off output terminal 20, and a D.C. component of the demodulated signal is applied to inverting input terminal 70 of D.C. voltage comparator 12 through LPF 22. The D.C. component is compared with the voltage applied to non-inverting input terminal 72 from reference voltage source 26 so that a D.C. output voltage as a function of the difference between the D.C. component and the reference voltage appears on the collector of transistor $Q_{22}$ and is applied to output terminal 16. Therefore, the D.C. level on output terminal 20 is held at a voltage equal to the reference voltage. Further, a D.C. output voltage on the collector of transistor $Q_{18}$, similar to the D.C. output voltage on the collector of transistor $Q_{22}$, may be used for an automatic frequency control (AFC).

Figure 4:
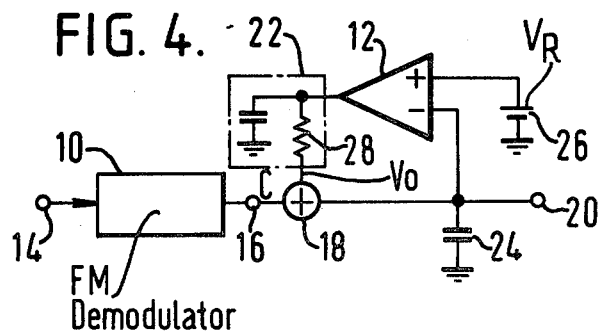
FIG. 4 shows a block diagram of another embodiment according to the present invention.

The embodiment of FIG. 4 is a modification of the FM detector shown in FIG. 1 wherein the low pass filter (LPF) 22 is connected to the output of the D.C. voltage comparator 12. Effectively the signal applied to adder 18 from D.C. voltage comparator 12 will be substantially the same as for the embodiment of FIG. 1.

What is claimed is:

1. A frequency modulation (FM) detector having a constant D.C. level output, for detecting the audio component of an FM signal, comprising:
   frequency modulation demodulator means directly coupled to receive said FM signal,
   adder means responsive to first and second input signals for maintaining a constant D.C. level output signal, said first signal being the output signal of said FM demodulator means, and
   feedback means connected to the output of said adder means for comparing the D.C. output level of said adder means with a reference signal level to produce the second signal.

2. The detector of claim 1 further comprising a low pass filter connected between said adder means and said feedback means.

3. The detector of claim 2 wherein said low pass filter is connected between the output of said adder means and the input of said feedback means.

4. The detector of claim 2 wherein said low pass filter is connected between the output of said feedback means and the input of said adder means.

5. The detector of claim 1 wherein said FM demodulator means is a quadrature type demodulator.

6. A frequency modulation (FM) detector having a constant D.C. level output, for detecting the audio component of an FM signal, comprising:
   FM demodulator means directly coupled to receive said FM signal, and
   D.C. voltage comparing means connected to the output of said FM demodulator means for comparing the D.C. output level of said FM demodulator means with a reference signal level to control the D.C. output level of said FM demodulator means.

* * * * *